(12) United States Patent
Cheng

(10) Patent No.: US 9,374,109 B2
(45) Date of Patent: *Jun. 21, 2016

(54) QPP INTERLEAVER/DE-INTERLEAVER FOR TURBO CODES

(71) Applicant: Optis Wireless Technology, LLC, Plano, TX (US)

(72) Inventor: Jung-Fu Cheng, Fremont, CA (US)

(73) Assignee: Optis Wireless Technology, LLC, Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/620,347

(22) Filed: Feb. 12, 2015

(65) Prior Publication Data

US 2015/0155886 A1 Jun. 4, 2015

Related U.S. Application Data

(63) Continuation of application No. 13/561,781, filed on Jul. 30, 2012, now Pat. No. 8,959,403, which is a continuation of application No. 11/936,242, filed on Nov. 7, 2007, now Pat. No. 8,239,711.

(60) Provisional application No. 60/865,233, filed on Nov. 10, 2006.

(51) Int. Cl.
*H03M 13/03* (2006.01)
*H03M 13/27* (2006.01)
*H03M 13/29* (2006.01)

(52) U.S. Cl.
CPC ...... *H03M 13/2739* (2013.01); *H03M 13/2957* (2013.01); *H03M 13/036* (2013.01)

(58) Field of Classification Search
CPC ............... H03M 13/2739; H03M 13/2957; H03M 13/275; H03M 13/276
See application file for complete search history.

(56) References Cited

PUBLICATIONS

Ryu et al., On quadratic inverses for quadratic permutation polynomials over integer rings, Nov. 2005, google.com (retrieved Oct. 22, 2015), pp. 1 to 12.*

* cited by examiner

*Primary Examiner* — Shelly A Chase
(74) *Attorney, Agent, or Firm* — Vincent J. Allen; James H. Ortega; Carstens & Cahoon, LLP

(57) ABSTRACT

A quadratic permutation polynomial (QPP) interleaver is described for turbo coding and decoding. The QPP interleaver has the form:

$\Pi(n) = f_1 n - f_2 n^2 \bmod K$, where the QPP coefficients $f_1$ and $f_2$ are designed to provide good error performance for a given block length K.

12 Claims, 3 Drawing Sheets

QPP INTERLEAVER/DE-INTERLEAVER FOR TURBO CODES

CROSS-REFERENCE TO RELATED APPLICATIONS

This application is a continuation of U.S. application Ser. No. 13/561,781, filed Jul. 30, 2012, now U.S. Pat. No. 8,959, 403, which is a continuation of U.S. application Ser. No. 11/936,242, filed Nov. 7, 2007, now U.S. Pat. No. 8,239,711, which claims the benefit of U.S. Provisional Application No. 60/865,233, filed Nov. 10, 2006, and this application is also related to International Application PCT/SE2007/050823, filed Nov. 7, 2007 which also claims the benefit of U.S. Provisional Application No. 60/865,233 filed Nov. 10, 2006, the disclosures of which are all incorporated herein by reference for all purposes.

TECHNICAL FIELD

The present invention relates generally to turbo codes for mobile communication systems and, more particularly, to the design of interleavers for turbo codes.

BACKGROUND OF THE INVENTION

The basic function of a communication system is to send information over a communication channel from a source that generates the information to one or more destinations. In a digital communication system, the information is converted into a digital format and then transmitted over the communication channel. The transmission of digital information is subject to the adverse effects of the communication channel, such as co-channel and adjacent channel interference, noise, dispersion, and fading. These effects introduce errors into the transmitted data stream. These effects are particularly severe in a radio communication system.

In 1948, Claude E. Shannon demonstrated in a landmark paper that proper encoding of the digital information prior to transmission may reduce the errors introduced by a noisy channel to any desired level. Encoding is the process of adding redundancy to information prior to its transmission so that errors which may occur during transmission can be detected and/or corrected. At the receiving end, the decoder makes use of the redundant information and a priori knowledge of the coding scheme to detect and/or correct errors that may have occurred during transmission.

Many types of error correction codes have been devised, including block codes and convolutional codes. Turbo codes, which were introduced in 1993, are considered to have high error correction capability and good performance and have been selected for use in third and fourth generation mobile communication systems. In its most basic form, a turbo code comprises two parallel systematic convolutional encoders connected in parallel by an interleaver. The first encoder operates on the original input bits and generates first parity bits. The interleaver permutes the order of the input bits and the interleaved bits are supplied to the second encoder. The second encoder operates on the interleaved bits output by the interleaver and generates second parity bits. For each input bit, three output bits are generated: the input bit and two parity bits.

Iterative decoding is used at the receiver to decode turbo codes. A basic turbo decoder comprises two soft-input, soft-output (SISO) decoders connected in series by an interleaver. The received bits are input to the first decoder. The first decoder uses the received bits and extrinsic information fed back from the second decoder to generate a soft estimate of the original input bits expressed as a log-likelihood ratio and extrinsic information that is supplied to the second decoder. The extrinsic information output from the first decoder is interleaved before it is input to the second decoder to compensate for the interleaving performed at the encoder. The second decoder generates a more refined log-likelihood estimate of the original input bit and extrinsic information that is fed back to the first decoder. A final decision about the bit is made by hard limiting the soft estimate output by the second decoder.

The properties of the interleaver are important to the performance of a turbo coder. When turbo codes were first introduced, pseudorandom interleavers were proposed. For long block lengths, pseudorandom interleavers are problematic because the interleavers require large storage resources. At small block lengths, pseudorandom interleavers do not perform well. Other types of interleavers have been proposed including inter-block permutation (IBP) interleavers and almost regular permutation (ARP) interleavers. More recently, quadratic permutation polynomial (QPP) interleavers have been proposed. QPP interleavers provide good performance, have low computational complexity, and allow contention free parallel decoding. However, the design of good QPP interleavers is difficult because the number of potential QPP coefficients is too large to simulate and test individually. Some general guidelines for selecting QPP parameters have been proposed, but do not always yield the best results.

SUMMARY

The present invention relates to a quadratic permutation polynomial (QPP) interleaver for turbo coding and decoding. The QPP interleaver has the form $$\Pi(n) = f_1 n - f_2 n^2 \bmod K,$$

where the QPP coefficients $f_1$ and $f_2$ are designed to provide good error performance for a given block length K. The QPP interleaver can be implemented with relatively simple hardware and enables contention free parallel decoding with multiple parallel decoders.

DETAILED DESCRIPTION OF PREFERRED EMBODIMENTS

Figure 1:
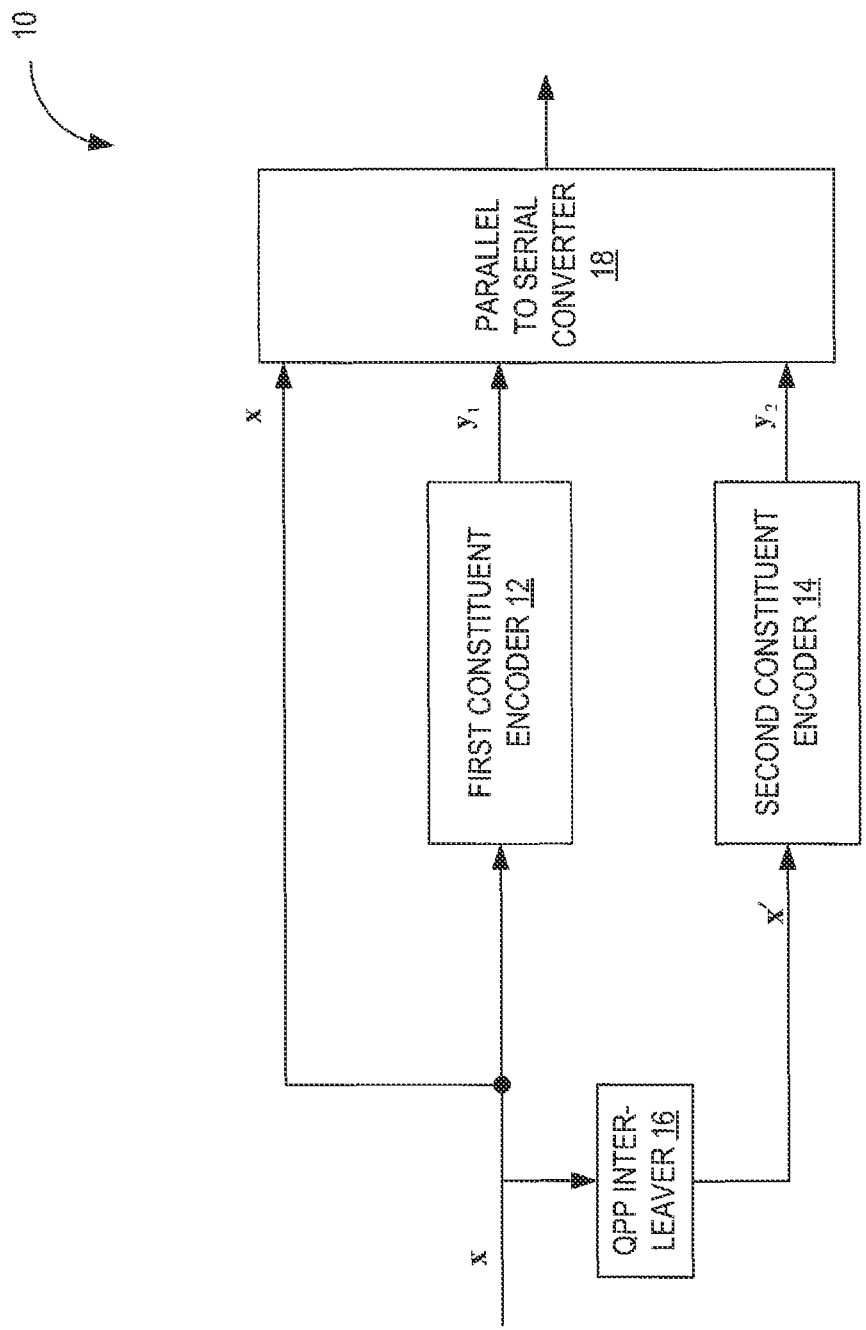
FIG. 1 is a block diagram of an exemplary turbo encoder.

The present invention relates generally to turbo coding for mobile communication systems. FIG. 1 shows the basic structure of a turbo encoder 10 according to one exemplary embodiment. The turbo encoder 10 comprises first and second constituent encoders 12, 14 respectively, a quadratic permutation polynomial (QPP) interleaver 16, and a parallel-to-serial converter 18. The first and second constituent encoders 12, 14 comprise systematic convolutional encoders. The same convolutional encoder may be used as both the first and second constituent encoders 12, 14. The first constituent encoder 12 operates on an input bit stream x, also referred to as the systematic bitstream, to generate a first parity bit stream $y_1$. The second constituent encoder 14 operates on an interleaved bit stream x' to generate second parity bits $y_2$. QPP interleaver 16 interleaves the input bit stream x to generate the interleaved bit stream x'. The interleaved bit stream x' represents a reordering of the original input bit stream x. The input bit stream x, and parity bit streams $y_1$ and $y_2$, are serialized by a parallel-to-serial converter 18 to generate the final output of the encoder 10.

Figure 2:
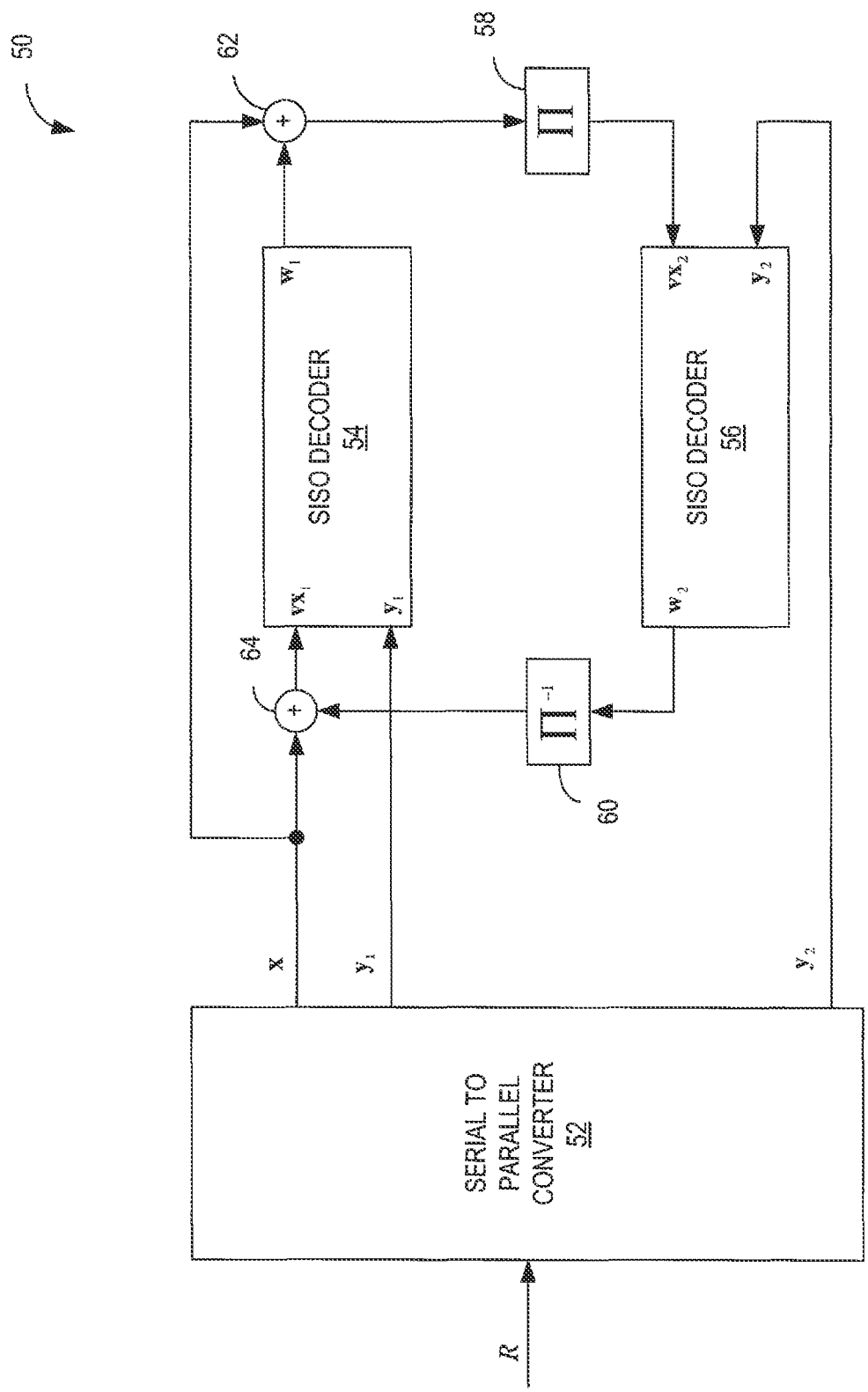
FIG. 2 is a block diagram of an exemplary turbo decoder.

FIG. 2 illustrates a turbo decoder 50 for decoding turbo codes. The turbo decoder 50 comprises a serial-to-parallel converter 52, single-input, single-output (SISO) decoders 54 and 56, QPP interleaver 58, QPP de-interleaver 60, and adders 62 and 64. The serial-to-parallel converter 52 separates the received signal R into three separate streams corresponding respectively to the systematic bitstream x, parity bitstream $y_1$, and parity bitstream $y_2$. Those skilled in the art will appreciate that the bitstreams x, $y_1$, and $y_2$ may contain bit errors that occurred during transmission. The function of the turbo decoder 50 is to detect and correct these bit errors.

The turbo decoder 50 is an iterative decoder. The first decoder 54 operates on inputs $vx_1$ and $y_1$ and generates first extrinsic information $w_1$ at its output. Adder 64 combines the systematic bits x with second extrinsic information $w_2$ output by the second decoder 56 to generate the input $vx_1$ to the first decoder 54. Similarly, the second decoder 56 operates on inputs $vx_2$ and $y_2$ and generates second extrinsic information $w_2$. Adder 62 combines the systematic bits x with the extrinsic information $w_1$ output from the first decoder 54. Interleaver 58 permutes the outputs of the adder 62 to obtain the second input $vx_2$. The interleaver 58 is the same as the QPP interleaver 16 employed by the turbo encoder 10. De-interleaver 60 permutes the extrinsic information $w_2$ output from the second decoder 56 before it is combined with the systematic bits x in adder 64. The de-interleaver 60 performs the reverse operation to restore the original order of the information.

According to the present invention, interleavers 16 and 58 and de-interleaver 60 each comprise a quadratic permutation polynomial (QPP) interleaver. QPP interleavers provide good error correction performance, have low computational complexity, and, if properly designed, allow contention-free access to the interleaver memory space. The interleaver permutes an input sequence of K symbols. The interleaver may be represented by a mapping function that maps a given output index in to a corresponding input index $\Pi(n)$. For a QPP interleaver, the input index $\Pi(n)$ is given by $$\Pi(n) = f_1 n + f_2 n^2 \bmod K \quad (1)$$

where $n \geq 0$ and $f_1$ and $f_2$ are integers less than K.

QPP output indexes can be computed recursively without multiplication or modular operations. A simplified illustration is given in the following:

$$\Pi(n+1) = f_1(n+1) + f_2(n+1)^2 \bmod K \quad (2)$$
$$= (f_1 n + f_2 n^2) + (f_1 + f_2 + 2f_2 n) \bmod K$$
$$= \Pi(n) + g(n) \bmod K$$

where $g(n) = f_1 + f_2 + 2f_2 n \bmod K$. It will be appreciated that g(n) can also be computed recursively according to:

$$g(n+1) = g(n) + 2f_2 \bmod K. \quad (3)$$

Because both $\Pi(n)$ and g(n) are greater than K, the modulo operations in both equations can be replaced by comparisons:

$$\Pi(n+1) = \begin{cases} \Pi(n) + g(n), & \text{if } \Pi(n) + g(n) < K \\ \Pi(n) + g(n) - K, & \text{otherwise} \end{cases} \quad (4)$$

$$g(n+1) = \begin{cases} g(n) + 2f_2, & \text{if } g(n) + 2f_2 < K \\ g(n) + 2f_2 - K, & \text{otherwise} \end{cases}$$

In some cases, the term $2f_2$ in Eq. (4) may be less than K. For these cases, the term $2f_2$ in the recursion of g(n) given by Eq. (4) may be replaced by $(2f_2 - K)$:

$$g(n+1) = \begin{cases} g(n) + (2f_2 - K), & \text{if } g(n) + (2f_2 - K) < K \\ g(n) + (2f_2 - K) - K, & \text{otherwise} \end{cases} \quad (5)$$

The computational complexity of the QPP interleaver is the same as that of an Almost Regular Permutation (ARP) interleaver.

Figure 3:
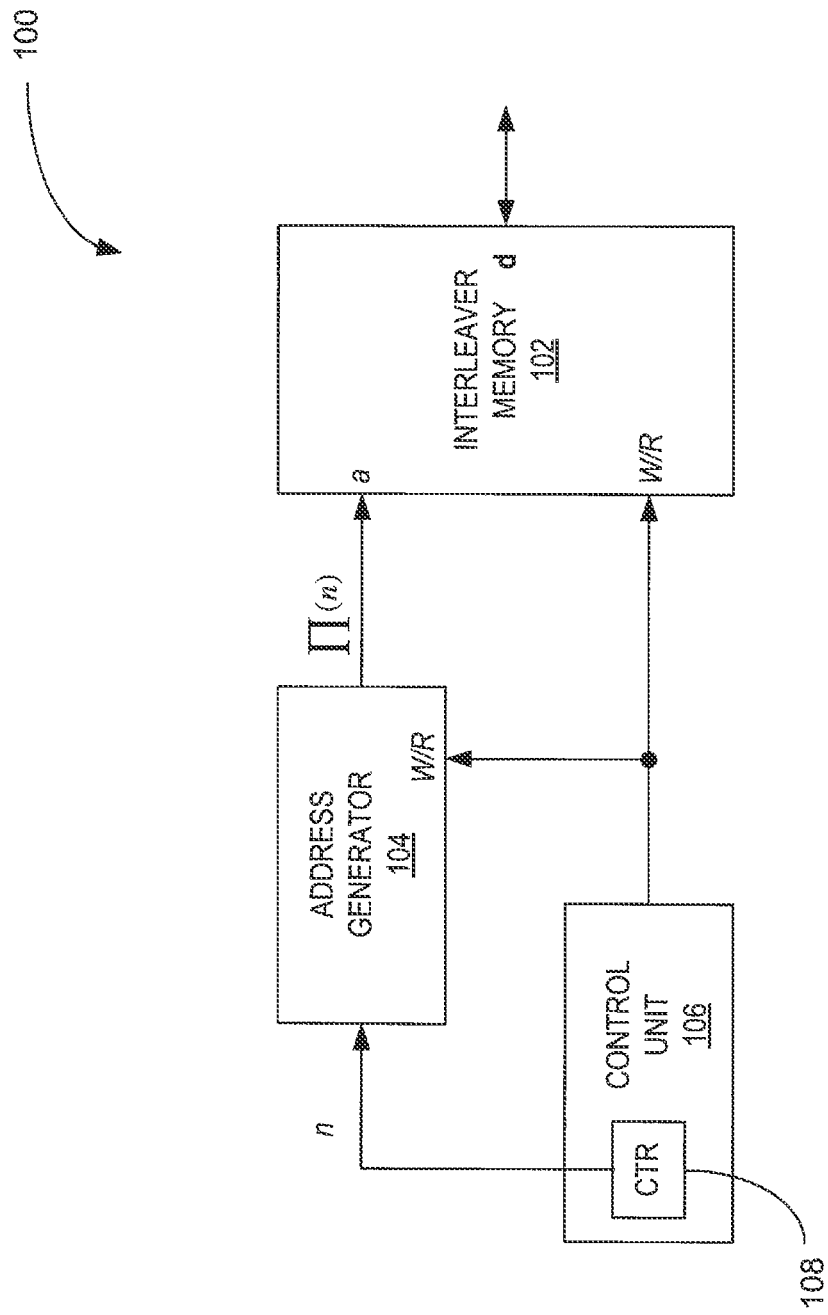
FIG. 3 is a block diagram of a QPP interleaver/de-interleaver.

FIG. 3 is a block diagram of an exemplary QPP interleaver 100. The QPP interleaver 100 may be used to implement the interleavers 16 and 58 in FIGS. 1 and 2 respectively, or to implement the de-interleaver 60 in FIG. 2. The QPP interleaver 100 comprises an interleave memory 102, address generator 104, and control unit 106. The interleave memory 102 stores a sequence of values (e.g. bits or soft values) that is being interleaved/de-interleaved. The address generator 104 permutes the values as they are written into or read from memory 102. The control unit 106 controls operation of the interleaver 100 as hereinafter described. The control unit 106 includes a modulo-counter 108 to provide an input index n for the address generator 104. Additionally, the control unit 106 generates a control signal for input to the address generator 104 and memory 102 to indicate whether a particular operation is a read or write operation.

In operation, data d is written into memory 102 in non-interleaved order, and is read out of memory in interleaved order when interleaved data is needed. In one exemplary embodiment, the values to be interleaved are read into sequential addresses in memory 102 and interleaving is performed while reading the values from memory 102. During interleaving operation, the counter 108 is incremented at a predetermined clock rate. In each clock period, the address generator 104 computes an input index $\Pi(n)$ according to Eq. (2), which is used to determine the address in memory 102 from which the current value is read. The data stored at the address provided by the address generator 104 is read out of memory 102.

Those skilled in the art will appreciate that interleaving may also be performed in the process of writing data to memory 102.

In the turbo decoder 50, a single interleaver 100 may be used to function as the interleaver 58 and de-interleaver 60. The extrinsic information $w_1$ output from decoder 54 is written sequentially into the memory 102 of the interleaver 100. The extrinsic information $w_2$ output from decoder 56 is written into the same memory 102. During each clock period, the decoder 56 reads one symbol of the first extrinsic information $w_1$ out of memory 102, and writes one symbol of the new extrinsic information $w_2$ back to the same memory location. Interleaving is performed during the read operation and de-interleaving is performed by the subsequent write operation.

As known in the art, the first and second decoders 54, 56 may be implemented as parallel decoders. That is, decoders

54, 56 may each comprise two or more parallel decoders. The memory space used by the interleaver 58 and de-interleaver 60 can be divided into M memory banks, where M is the number of parallel decoders. To support parallel read-write access to these memory banks, a contention-free criterion is imposed on the interleaver 58 and de-interleaver 60. More specifically, during any given clock tick, each of the parallel decoders comprising decoders 54 or 56 should access different ones of the memory banks.

For any M that divides K, QPP interleavers support parallel decoding with M decoders. Let K=MW, then the primary index of Π(i+tW), for any t, is given by $$\Pi(n+tW) \bmod W = f_1(n+tW) + f_2(n+tW)^2 \bmod W \quad (6)$$

$$= (f_1 n + f_2 n^2) + (f_1 t + 2f_2 tn + t^2 f_2 W) W \bmod W$$

$$= \Pi(n) \bmod W$$

As an example, let K=320=$2^6 \times 5$ and Π(n)=$19n+40n^2$ mod 320. In this example, it is possible to decode contention free with 2 decoders (i.e. M=2 and W=160) as shown in Table 1 below.

TABLE 1

Parallel Decoding with 2 Decoders

| Tick | Logical Index D0 | Logical Index D1 | Intra-block index | Inter-block permutation D0 | Inter-block permutation D1 |
|---|---|---|---|---|---|
| 0 | 0 | 160 | 0 | 0 | 1 |
| 1 | 59 | 219 | 59 | 0 | 1 |
| 2 | 198 | 38 | 38 | 1 | 0 |
| 3 | 97 | 257 | 97 | 0 | 1 |
| 4 | 76 | 236 | 76 | 0 | 1 |
| 5 | 135 | 295 | 135 | 0 | 1 |
| 6 | 274 | 114 | 114 | 1 | 0 |
| 7 | 173 | 13 | 13 | 1 | 0 |
| 8 | 152 | 312 | 152 | 0 | 1 |
| 9 | 211 | 51 | 51 | 1 | 0 |
| . | . | . | . | . | . |
| . | . | . | . | . | . |
| . | . | . | . | . | . |

Table 1 gives the logical indexes for first and second parallel decoders, denoted D0 and D1 respectively. The column labeled intra-block permutation gives the logical index within a single memory bank. It may be noted that each of the decoders accesses the same logical address with its respective memory bank in the same clock tick. For example, at tick=2, each of the parallel decoders reads from the 38th address in its respective memory bank. The inter-block permutation indicates which of the two memory banks are currently being used by the first and second decoders D0 and D1 respectively. It can be noted that at any given clock tick, the parallel decoders D0 and D1 read and/or write from different memory banks.

It is also possible to decode with 4 or 5 parallel decoders as shown in Tables 2 and 3 respectively.

TABLE 2

Parallel Decoding with 4 Decoders

| Tick | Logical Indexes D0 | D1 | D2 | D3 | Intra-block index | Inter-block permutation D0 | D1 | D2 | D3 |
|---|---|---|---|---|---|---|---|---|---|
| 0 | 0 | 240 | 160 | 80 | 0 | 0 | 3 | 2 | 1 |
| 1 | 59 | 299 | 219 | 139 | 59 | 0 | 3 | 2 | 1 |
| 2 | 198 | 118 | 38 | 278 | 38 | 2 | 1 | 0 | 3 |
| 3 | 97 | 17 | 257 | 177 | 17 | 1 | 0 | 3 | 2 |
| 4 | 76 | 316 | 236 | 156 | 76 | 0 | 3 | 2 | 1 |
| 5 | 135 | 55 | 295 | 215 | 55 | 1 | 0 | 3 | 2 |
| 6 | 274 | 194 | 114 | 34 | 34 | 3 | 2 | 1 | 0 |
| 7 | 173 | 93 | 13 | 253 | 13 | 2 | 1 | 0 | 3 |
| 8 | 152 | 72 | 312 | 232 | 72 | 1 | 0 | 3 | 2 |
| 9 | 211 | 131 | 51 | 291 | 51 | 2 | 1 | 0 | 3 |
| . | . | . | . | . | . | . | . | . | . |
| . | . | . | . | . | . | . | . | . | . |
| . | . | . | . | . | . | . | . | . | . |

TABLE 3

Parallel Decoding with 5 Decoders

| Tick | Logical indexes D0 | D1 | D2 | D3 | D4 | Intra-block | Inter-block permutation D0 | D1 | D2 | 03 | 04 |
|---|---|---|---|---|---|---|---|---|---|---|---|
| 0 | 0 | 256 | 192 | 128 | 64 | 0 | 0 | 4 | 3 | 2 | 1 |
| 1 | 59 | 315 | 251 | 187 | 123 | 59 | 0 | 4 | 3 | 2 | 1 |
| 2 | 198 | 134 | 70 | 6 | 262 | 6 | 3 | 2 | 1 | 0 | 4 |
| 3 | 97 | 33 | 289 | 225 | 161 | 33 | 1 | 0 | 4 | 3 | 2 |
| 4 | 76 | 12 | 268 | 204 | 140 | 12 | 1 | 0 | 4 | 3 | 2 |
| 5 | 135 | 71 | 7 | 263 | 199 | 7 | 2 | 1 | 0 | 4 | 3 |
| 6 | 274 | 210 | 146 | 82 | 18 | 18 | 4 | 3 | 2 | 1 | 0 |
| 7 | 173 | 109 | 45 | 301 | 237 | 45 | 2 | 1 | 0 | 4 | 3 |
| 8 | 152 | 88 | 24 | 280 | 216 | 24 | 2 | 1 | 0 | 4 | 3 |
| 9 | 211 | 147 | 83 | 19 | 275 | 19 | 3 | 2 | 1 | 0 | 4 |
| . | . | . | . | . | . | . | . | . | . | . | . |
| . | . | . | . | . | . | . | . | . | . | . | . |
| . | . | . | . | . | . | . | . | . | . | . | . |

In fact, it is possible to decode with 2, 4, 5, 8, 10, 16, 20, . . . parallel decoders. Thus, the contention free property of the QPP interleaver permits flexibility in the receiver design and pooling of decoding resources.

Good decoding performance can be achieved with properly designed QPP parameters. The problem is the complexity of selecting QPP parameters, such as the block length K and the QPP coefficients $f_1$ and $f_2$. In general, performance of the QPP interleaver improves as K increases. The problem of finding a good pair of QPP coefficients $f_1$ and $f_2$ for a practical block length K is made difficult because the dimension of the search space grows exponentially with the block length. Using the block length K=2048 as an example, the number of valid QPP coefficient pairs in the search space is more than one million. It is clear that exhaustive performance simulations over all possible QPP coefficient pairs cannot serve as a viable approach to find the best QPP coefficients. A practical search approach requires exploitation of further structural properties of the QPP interleavers.

One aspect of the present invention comprises a search algorithm to identify QPP parameters. By considering the algebraic-geometric properties of QPP interleavers, two important quantities of QPP interleavers can be identified: the modified degrees of nonlinearity ζ' and the spread factor D. A brief description of the modified degrees of nonlinearity ζ' and the spread factor D are presented below to assist the description of the search algorithm.

A QPP interleaver can be decomposed into ζ linear interleavers that are disturbed by ($f_2 x^2$ mod K) at every index x.

The quantity $\zeta$ is called the degree of nonlinearity of a QPP interleaver and is given by $$\zeta = K/gcd(2f_2, K) \qquad \text{Eq. (7)}$$

where $gcd(2f_2, K)$ is the greatest common divisor of $2f_2$ and K. Since some of the disturbances may be identical, the modified degree of nonlinearity $\zeta'$ is defined as the number of distinct elements in the list of disturbances $$\{f_2 x^2 \bmod K, \text{ where } x = 0, 1, \ldots \zeta-1\} \qquad \text{Eq. (8)}.$$

The spread factor D is defined as the minimum local spread generated by disturbances when the QPP interleaver is considered as an interleaver-code Q in an algebraic-geometric space. First, the representatives of orbits of the interleaver-code is defined as $$\Theta = \{(x, f_1 x + f_2 x^2 \bmod K), \text{ where } x = 0, 1, \ldots \zeta-1\} \qquad \text{Eq. (9)}$$

For each algebraic-geometric point p from the set of representatives $\Theta$, a local spread can be computed as:

$$Dp = \min\{\delta_K(p, p'), \text{ where } p' \text{ is any point in } Q \text{ and } \delta_K(p, p') \leq \sqrt{2K}\}, \qquad \text{Eq. (10)}$$

The term $\delta_K(p, p')$ in Eq. 10 is the modulo-K Lee distance between the two algebraic-geometric points p and p'. The spread factor of a QPP interleaver is then defined as the smallest local spread of the representatives:

$$D = \min\{D_p, \text{ where } p \text{ is in } \Theta\} \qquad \text{Eq. (11)}$$

Both quantities $\zeta'$ and D can be considered as measures of the randomness of a QPP interleaver. Since random interleavers have been shown to be beneficial for turbo coding performance, it has been proposed to find QPP coefficients based on maximization of the following metric:

$$\Omega = \zeta' \times \log(D) \qquad \text{Eq. (12)}$$

This search criterion alone, however, does not work very well. For instance, let K=64. One candidate $f_1=1$ and $f_2=4$ has $\zeta'=4$ and D=4. Another candidate $f_1=7$ and $f_2=16$ has $\zeta'=2$ and D=8. It can be verified that the $\Omega$ metric for the former is greater than the later even though the turbo coding performance based on the later QPP candidate is better.

Another shortcoming of the metric given by Eq. 12 is that the multiplicity of error events is not considered. Two of the most important performance parameters of a turbo code are the so-called $d_2$ distance and its multiplicity $N_{d2}$. The $d_2$ distance is defined as the minimum Hamming weight in the turbo codeword generated by an input sequence of K-2 zeros and 2 ones, which are called the weight-2 input sequences. The corresponding multiplicity $N_{d2}$ is the number of such codewords. It is noted that the multiplicity $N_{d2}$ can be computed by testing all K(K-1) weight-2 input sequences for any QPP coefficient candidates. However, complexity of such computation grows quadratically with the block length K. It would quickly become impractical to incorporate such $N_{d2}$ computation routine into the test of every QPP coefficient candidate.

According to the present invention, the multiplicity N can be computed at the same time as the computation of the spread factor D. Suppose $p^*$ is an orbit representative that has the minimum local spread $Dp^*=D$. Let $Np^*$ be the number of algebraic-geometric points p' with Lee distance D away from $p^*$. Note $Np^*$ that can be computed at the same time as the local spread of the point $p^*$. The multiplicity N can then be computed by $$N = \zeta' \times Np^* \qquad \text{Eq. (13)}$$

Using this approach, the search algorithm for good QPP coefficients is as follows. In the first step, three parameters are computed for each QPP candidates: the modified degrees of nonlinearity $\zeta'$, the spread factor D, and the multiplicity N. In the second step, the candidates are ranked firstly by the spread factor D, secondly by the modified degrees of nonlinearity $\zeta'$, and thirdly by the multiplicity N. That is, if two QPP candidates have the same spread factor but different modified degrees of nonlinearity, the one with the lower modified degrees of nonlinearity is discarded. Similarly, if two QPP candidates have the same spread factor and the modified degree of nonlinearity, the one with higher multiplicity is discarded. In the third step, the ranked list of candidates is truncated by keeping those candidates with spread factors in the vicinity of $\sqrt{K/2}$ In the following, we shall use the search of QPP coefficients for K=352 as an illustrative example of the search algorithm. Since any prime number dividing K must also divide the $f_2$ coefficient, there are at least three candidates for $f_2$: 22, 44 and 88. Since $f_1$ and K should not have any non-trivial common divisor, there are at least 160 candidates. Hence, there are approximately 480 valid QPP interleaver coefficients to search. A few exemplary candidates after the first step are listed below:

TABLE 4

Search Example

| Candidate | $f_1$ | $f_2$ | $\zeta'$ | D | N |
|---|---|---|---|---|---|
| A | 65 | 88 | 2 | 22 | 352 |
| B | 21 | 88 | 2 | 22 | 528 |
| C | 21 | 44 | 3 | 22 | 264 |
| D | 23 | 44 | 3 | 22 | 352 |
| E | 5 | 22 | 4 | 8 | 44 |
| F | 3 | 22 | 4 | 8 | 88 |

In step two, the list of candidates will are ranked and reduced. For instance, candidates A and B will be discarded because they have the same spread factor as candidates C and D but lower degrees of nonlinearity. Similarly, candidates D and F are discarded because they have the same spread factor and the modified degree of nonlinearity as candidates C and E but higher multiplicity. Hence, the search algorithm narrows down the 480 QPP candidates down to two: candidate C with $f_1=21$ and $f_2=44$ and candidate E with $f_1=5$ and $f_2=22$. Further performance verification based on union bounds or simulation can be used to compare the two remaining candidates. It is found that candidate C with $f_1=21$ and $f_2=44$ gives the better performance.

Table 5 below provides a set of QPP interleaver designs that have been found to yield good performance using the search criteria outlined above.

TABLE 5

QPP Parameters for Turbo Coding

| Block Length (K) | QPP Coefficient ($f_1$) | QPP Coefficient ($f_2$) | Preferred Parallelization Orders to 32 |
|---|---|---|---|
| 64 | 7 | 16 | 1, 2, 4, 8, 16, 32 |
| 96 | 11 | 24 | 1, 2, 3, 4, 6, 8, 12, 16, 24, 32 |
| 136 | 9 | 34 | 1, 2, 4, 8, 17 |

TABLE 5-continued

QPP Parameters for Turbo Coding

| Block Length (K) | QPP Coefficient ($f_1$) | QPP Coefficient ($f_2$) | Preferred Parallelization Orders to 32 |
|---|---|---|---|
| 152 | 9 | 38 | 1, 2, 4, 8, 19 |
| 176 | 21 | 44 | 1, 2, 4, 8, 11, 16, 22 |
| 200 | 13 | 50 | 1, 2, 4, 5, 8, 10, 20, 25 |
| 216 | 11 | 36 | 1, 2, 3, 4, 6, 8, 9, 12, 18, 24, 27 |
| 224 | 27 | 56 | 1, 2, 4, 7, 8, 14, 16, 28, 32 |
| 240 | 29 | 60 | 1, 2, 3, 4, 5, 6, 8, 10, 12, 15, 16, 20, 24, 30 |
| 296 | 19 | 74 | 1, 2, 4, 8 |
| 312 | 19 | 78 | 1, 2, 3, 4, 6, 8, 12, 13, 24, 26 |
| 328 | 21 | 82 | 1, 2, 4, 8 |
| 352 | 21 | 44 | 1, 2, 4, 8, 11, 16, 22, 32 |
| 384 | 23 | 48 | 1, 2, 4, 6, 8, 12, 16, 24, 32 |
| 416 | 25 | 52 | 1, 2, 4, 8, 13, 16, 26, 32 |
| 432 | 47 | 72 | 1, 2, 3, 4, 6, 8, 9, 12, 16, 18, 24, 27 |
| 456 | 29 | 114 | 1, 2, 3, 4, 6, 8, 12, 19, 24 |
| 472 | 29 | 118 | 1, 2, 4, 8 |
| 504 | 55 | 84 | 1, 2, 3, 4, 6, 7, 8, 9, 12, 14, 18, 21, 24, 28 |
| 528 | 17 | 66 | 1, 2, 3, 4, 6, 8, 11, 12, 16, 22, 24 |
| 576 | 65 | 96 | 1, 2, 3, 4, 6, 8, 9, 12, 16, 18, 24, 32 |
| 592 | 19 | 74 | 1, 2, 4, 8, 16 |
| 608 | 37 | 76 | 1, 2, 4, 8, 16, 19, 32 |
| 688 | 21 | 86 | 1, 2, 4, 8, 16 |
| 720 | 79 | 120 | 1, 2, 3, 4, 5, 6, 8, 9, 10, 12, 15, 16, 18, 20, 24, 30 |
| 784 | 25 | 98 | 1, 2, 4, 7, 8, 14, 16, 28 |
| 832 | 25 | 52 | 1, 2, 4, 8, 13, 16, 26, 32 |
| 912 | 29 | 114 | 1, 2, 3, 4, 6, 8, 12, 16, 19, 24 |
| 928 | 15 | 58 | 1, 2, 4, 8, 16, 29, 32 |
| 960 | 29 | 60 | 1, 2, 3, 4, 5, 6, 8, 10, 12, 15, 16, 20, 24, 30, 32 |
| 1008 | 55 | 84 | 1, 2, 3, 4, 6, 7, 8, 9, 12, 14, 16, 18, 21, 24, 28 |
| 1056 | 17 | 66 | 1, 2, 3, 4, 6, 8, 11, 12, 16, 22, 24, 32 |
| 1152 | 35 | 72 | 1, 2, 3, 4, 6, 8, 9, 12, 16, 18, 24, 32 |
| 1184 | 19 | 74 | 1, 2, 4, 8, 16, 32 |
| 1248 | 19 | 78 | 1, 2, 3, 4, 6, 8, 12, 13, 16, 24, 26, 32 |
| 1312 | 21 | 82 | 1, 2, 4, 8, 16, 32 |
| 1376 | 21 | 86 | 1, 2, 4, 8, 16, 32 |
| 1408 | 43 | 88 | 1, 2, 4, 8, 11, 16, 22, 32 |
| 1472 | 45 | 92 | 1, 2, 4, 8, 16, 23, 32 |
| 1568 | 13 | 28 | 1, 2, 4, 7, 8, 14, 16, 28, 32 |
| 1632 | 25 | 102 | 1, 2, 3, 4, 6, 8, 12, 16, 17, 24, 32 |
| 1760 | 27 | 110 | 1, 2, 4, 5 8, 10, 11, 26, 20, 22, 32 |
| 1824 | 29 | 114 | 1, 2, 3, 4, 6, 8, 12, 16, 19, 24, 32 |
| 1856 | 57 | 116 | 1, 2, 4, 8, 16, 29, 32 |
| 2112 | 17 | 66 | 1, 2, 3, 4, 6, 8, 11, 12, 16, 22, 24, 32 |
| 2816 | 43 | 88 | 1, 2, 4, 8, 11, 16, 22, 32 |
| 2944 | 45 | 92 | 1, 2, 4, 8, 16, 23, 32 |
| 3072 | 47 | 96 | 1, 2, 3, 4, 6, 8, 12, 16, 24, 32 |
| 3136 | 13 | 28 | 1, 2, 4, 7, 8, 14, 16, 28, 32 |
| 3328 | 51 | 104 | 1, 2, 4, 8, 13, 16, 26, 32 |
| 4160 | 33 | 130 | 1, 2, 4, 5, 8, 10, 13, 16, 20, 26, 32 |
| 4288 | 33 | 134 | 1, 2, 4, 8, 16, 32 |
| 4416 | 35 | 138 | 1, 2, 3, 4, 6, 8, 12, 16, 23, 24, 32 |
| 4672 | 37 | 146 | 1, 2, 4, 8, 16, 32 |
| 5056 | 39 | 158 | 1, 2, 4, 8, 16, 32 |
| 5120 | 39 | 80 | 1, 2, 4, 5, 8, 10, 16, 20, 32 |
| 5184 | 31 | 96 | 1, 2, 3, 4, 6, 8, 9, 12, 16, 18, 24, 27, 32 |
| 5312 | 41 | 166 | 1, 2, 4, 8, 16, 32 |
| 5504 | 21 | 86 | 1, 2, 4, 8, 16, 32 |
| 5568 | 43 | 174 | 1, 2, 3, 4, 6, 8, 12, 16, 24, 29, 32 |
| 5696 | 45 | 178 | 1, 2, 4, 8, 16, 32 |
| 5952 | 47 | 186 | 1, 2, 3, 4, 6, 8, 12, 16, 24, 31, 32 |
| 6016 | 23 | 94 | 1, 2, 4, 8, 16, 32 |
| 6080 | 47 | 190 | 1, 2, 4, 5, 8, 10, 16, 19, 20, 32 |

Each row in Table 5 represents one QPP parameter set or interleaver design. These interleaver designs can be used for turbo codes with either tail-biting or terminated trellises.

Selected QPP interleaver designs listed in Table 5 were simulated with rate 1/3 turbo codes based on Rel6-type trellis termination as illustrated in GPP TS 25.212 v6. For an input block of K bits, the coded output contains 3K+12 bits. The coded bits were assumed to be carried by QPSK modulation over an additive white Gaussian noise (AWGN) channel. The received bits were decoded by a Max-Log MAP turbo decoder as shown in FIG. 2. Block error rates were measured after 8 iterations. A turbo coder with a Prunable Prime Interleaver (PIL) was used for reference. The required SNR for target Block Error Rates (BLER) of 10%, 1%, 0.1%, and 0.01% are shown in Tables 6-9.

TABLE 6

Performance Comparison to PIL for BLER = 10%

| Block Length (k) | $E_b/N_o$ (PIL) | $E_b/N_o$ difference |
|---|---|---|
| 40 | 1.547 | −0.027 |
| 52 | 1.471 | −0.046 |
| 67 | 1.362 | −0.045 |
| 87 | 1.274 | −0.41 |
| 99 | 1.220 | −0.040 |
| 113 | 1.167 | −0.021 |
| 129 | 1.112 | −0.041 |
| 146 | 1.071 | −0.027 |
| 167 | 1.014 | −0.023 |
| 190 | 0.971 | −0.021 |
| 216 | 0.913 | 0.018 |
| 246 | 0.886 | −0.008 |
| 280 | 0.845 | −0.008 |
| 319 | 0.817 | −0.010 |
| 363 | 0.775 | 0.016 |
| 384 | 0.777 | −0.008 |
| 414 | 0.734 | −0.005 |
| 471 | 0.713 | 0.004 |
| 536 | 0.676 | 0.004 |
| 611 | 0.654 | 0.019 |
| 695 | 0.632 | 0.015 |
| 792 | 0.621 | 0.009 |
| 902 | 0.590 | 0.012 |
| 1027 | 0.579 | 0.011 |
| 1169 | 0.563 | −0.003 |
| 1331 | 0.536 | 0.009 |
| 1536 | 0.529 | 0.005 |
| 1725 | 0.512 | 0.001 |
| 1965 | 0.503 | 0.009 |
| 2237 | 0.489 | 0.003 |
| 2304 | 0.493 | −0.002 |
| 2547 | 0.482 | −0.013 |
| 2900 | 0.470 | −0.000 |
| 3302 | 0.464 | 0.003 |
| 3760 | 0.458 | −0.008 |
| 4096 | 0.451 | −0.001 |
| 4281 | 0.443 | −0.001 |
| 4874 | 0.443 | −0.004 |
| 5550 | 0.433 | 0.003 |
| 6144 | 0.424 | 0.003 |
| 7195 | 0.421 | 0.018 |
| 8192 | 0.412 | −0.003 |

TABLE 7

Performance Comparison to PIL for BLER = 1%

| Block Length (k) | $E_b/N_o$ (PIL) | $E_b/N_o$ difference |
|---|---|---|
| 40 | 2.675 | −0.056 |
| 52 | 2.461 | −0.042 |
| 67 | 2.263 | −0.052 |
| 87 | 2.078 | −0.042 |
| 99 | 1.965 | −0.030 |
| 113 | 1.882 | −0.029 |
| 129 | 1.803 | −0.057 |
| 146 | 1.723 | −0.052 |
| 167 | 1.596 | −0.017 |
| 190 | 1.533 | −0.030 |
| 216 | 1.440 | −0.011 |
| 246 | 1.371 | −0.015 |
| 280 | 1.305 | −0.008 |
| 319 | 1.242 | −0.007 |
| 363 | 1.189 | 0.008 |
| 384 | 1.172 | −0.010 |
| 414 | 1.120 | −0.002 |
| 471 | 1.080 | 0.008 |
| 536 | 1.026 | −0.007 |
| 611 | 0.969 | 0.007 |
| 695 | 0.941 | 0.006 |
| 792 | 0.897 | 0.005 |
| 902 | 0.863 | −0.011 |
| 1027 | 0.826 | −0.001 |

TABLE 7-continued

Performance Comparison to PIL for BLER = 1%

| Block Length (k) | $E_b/N_o$ (PIL) | $E_b/N_o$ difference |
|---|---|---|
| 1169 | 0.790 | 0.001 |
| 1331 | 0.768 | −0.011 |
| 1536 | 0.727 | 0.001 |
| 1725 | 0.705 | −0.002 |
| 1965 | 0.680 | 0.003 |
| 2237 | 0.658 | −0.006 |
| 2304 | 0.654 | −0.010 |
| 2547 | 0.641 | −0.006 |
| 2900 | 0.618 | −0.002 |
| 3302 | 0.596 | 0.006 |
| 3760 | 0.578 | −0.000 |
| 4096 | 0.569 | −0.001 |
| 4281 | 0.565 | 0.001 |
| 4874 | 0.548 | 0.003 |
| 5550 | 0.534 | 0.009 |
| 6144 | 0.519 | 0.005 |
| 7195 | 0.511 | 0.021 |
| 8192 | 0.498 | −0.000 |

TABLE 8

Performance Comparison to PIL for BLER = 0.1%

| Block Length (k) | $E_b/N_o$ (PIL) | $E_b/N_o$ difference |
|---|---|---|
| 40 | 3.525 | −0.110 |
| 52 | 3.237 | −0.099 |
| 67 | 2.941 | −0.084 |
| 87 | 2.692 | −0.091 |
| 99 | 2.558 | −0.080 |
| 113 | 2.434 | −0.074 |
| 129 | 2.362 | −0.114 |
| 146 | 2.230 | −0.087 |
| 167 | 2.047 | −0.052 |
| 190 | 1.954 | −0.054 |
| 216 | 1.829 | −0.032 |
| 246 | 1.743 | −0.027 |
| 280 | 1.659 | −0.017 |
| 319 | 1.546 | 0.009 |
| 363 | 1.500 | −0.000 |
| 384 | 1.475 | −0.035 |
| 414 | 1.427 | −0.036 |
| 471 | 1.342 | 0.013 |
| 536 | 1.303 | −0.038 |
| 611 | 1.220 | −0.004 |
| 695 | 1.168 | −0.007 |
| 792 | 1.113 | −0.014 |
| 902 | 1.059 | −0.017 |
| 1027 | 1.004 | −0.002 |
| 1169 | 0.963 | −0.004 |
| 1331 | 0.923 | −0.003 |
| 1536 | 0.888 | −0.013 |
| 1725 | 0.849 | −0.007 |
| 1965 | 0.818 | −0.012 |
| 2237 | 0.792 | −0.020 |
| 2304 | 0.778 | −0.014 |
| 2547 | 0.763 | −0.017 |
| 2900 | 0.736 | −0.013 |
| 3302 | 0.709 | −0.004 |
| 3760 | 0.687 | −0.014 |
| 4096 | 0.679 | −0.019 |
| 4281 | 0.664 | −0.008 |
| 4874 | 0.640 | −0.001 |
| 5550 | 0.628 | −0.006 |
| 6144 | 0.613 | −0.013 |
| 7195 | 0.600 | 0.005 |
| 8192 | 0.589 | −0.019 |

TABLE 9

Performance Comparasion to PIL for BLER = 0.01%

| Block Length (k) | $E_b/N_o$ (PIL) | $E_b/N_o$ difference |
|---|---|---|
| 40 | 4.258 | −0.161 |
| 52 | 3.937 | −0.191 |
| 67 | 3.614 | −0.208 |
| 87 | 3.312 | −0.186 |
| 99 | 3.163 | −0.198 |
| 113 | 2.967 | −0.104 |
| 129 | 2.940 | −0.200 |
| 146 | 2.811 | −0.190 |
| 167 | 2.541 | −0.167 |
| 190 | 2.395 | −0.154 |
| 216 | 2.219 | 0.074 |
| 246 | 2.107 | −0.045 |
| 280 | 2.005 | −0.061 |
| 319 | 1.858 | −0.009 |
| 363 | 1.787 | −0.013 |
| 384 | 1.792 | −0.100 |
| 414 | 1.695 | −0.057 |
| 471 | 1.588 | 0.028 |
| 536 | 1.548 | −0.076 |
| 611 | 1.505 | −0.041 |
| 695 | 1.391 | −0.024 |
| 792 | 1.331 | −0.059 |
| 902 | 1.246 | −0.003 |
| 1027 | 1.204 | −0.032 |
| 1169 | 1.152 | −0.045 |
| 1331 | 1.091 | −0.033 |
| 1536 | 1.082 | −0.071 |
| 1725 | 1.019 | −0.060 |
| 1965 | 0.996 | −0.061 |
| 2237 | 1.005 | −0.119 |
| 2304 | 0.922 | −0.35 |
| 2547 | 0.927 | −0.076 |
| 2900 | 0.854 | −0.035 |
| 3302 | 0.859 | −0.061 |
| 3760 | 0.877 | −0.116 |
| 4096 | 0.933 | −0.184 |
| 4281 | 0.791 | −0.056 |
| 4874 | 0.780 | −0.050 |
| 5550 | 0.902 | −0.207 |
| 6144 | 0.810 | −0.135 |
| 7195 | 0.759 | −0.083 |
| 8192 | 0.887 | −0.241 |

The simulations shows good error performance for the QPP interleaver designs using a relatively simple hardware implementation. Additionally, the QPP interleaver designs enable contention-free decoder with parallel decoders.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method for interleaving a sequence of values using a turbo coder, said method comprising:
   encoding an input sequence with a first encoder;
   reordering said input sequence with an interleaver to generate a corresponding output sequence; and
   encoding said output sequence with a second encoder, wherein, for an input sequence having a block length of sixty-four (64), the reordering comprises mapping input bits in said input sequence to corresponding output bits in said output sequence according to the function $\Pi(n)=7n+16n^2 \mod 64$, where $\Pi(n)$ is the input index of a corresponding input bit in the input sequence.

2. The method of claim 1, wherein mapping values in said input sequence to corresponding output bits in an output sequence comprises storing said input bits in memory, and interleaving said input bits with said interleaver as said input bits are read into or read out of said memory.

3. The method of claim 2, wherein said input bits are read into said memory in non-interleaved order and read out in interleaved order.

4. The method of claim 2, wherein said input bits are read into said memory in interleaved order.

5. The method of claim 1, wherein at least one of the first and second encoders is a constituent encoder comprising a systematic convolutional encoder.

6. The method of claim 1, further comprising serializing the input bits and the output bits with a parallel-to-serial converter to generate said final output sequence.

7. A method for interleaving a sequence of values using a turbo coder, said method comprising:
   encoding an input sequence with a first encoder;
   reordering said input sequence with an interleaver to generate a corresponding output sequence; and
   encoding said output sequence with a second encoder, wherein the reordering comprises mapping input bits in said input sequence to corresponding output bits in said output sequence according to the function $\Pi(n)=f_1 n + f_2 n^2 \mod K$, where $\Pi(n)$ is the input index of a corresponding value in the input sequence, $f_1$ and $f_2$ are QPP coefficients, and K is the block length of the input sequence, and
   wherein the block length K and QPP coefficients $f_1$ and $f_2$ comprise one of the QPP parameter sets listed in Table 5.

8. The method of claim 7, wherein said mapping input bits in said input sequence to corresponding output bits in an output sequence comprises storing said input bits in memory, and interleaving said input bits with said interleaver as said input bits are read into or read out of said memory.

9. The method of claim 8, wherein said input bits are read into said memory in non-interleaved order and read out in interleaved order.

10. The method of claim 8, wherein said values are read into said memory in interleaved order.

11. The method of claim 7, wherein at least one of the first and second encoders is a constituent encoder comprising a systematic convolutional encoder.

12. The method of claim 7, further comprising serializing the input bits and the output bits with a parallel-to-serial converter to generate said final output sequence.

* * * * *